United States Patent [19]

Lau et al.

[11] 4,153,835

[45] May 8, 1979

[54] TEMPERATURE COMPENSATION CIRCUIT

[75] Inventors: Chun-Lim Lau, Brooklyn, N.Y.; Richard G. Smith, Basking Ridge, N.J.

[73] Assignee: Bell Telephone Laboratories, Incorporated, Murray Hill, N.J.

[21] Appl. No.: 827,617

[22] Filed: Aug. 25, 1977

[51] Int. Cl.² ............................................. H01J 39/12
[52] U.S. Cl. .................................. 250/214 C; 250/338
[58] Field of Search .................... 307/310; 250/214 C, 250/214 R, 338; 340/237 S; 330/23

[56] References Cited
U.S. PATENT DOCUMENTS 3,755,679  8/1973  Otsuka ................................. 307/310

OTHER PUBLICATIONS

IBM Tech. Discl. Bul., vol. 6, No. 12, May, 1964, p. 24, Temp. Contr., Halperin.

*Primary Examiner*—John Kominski
*Attorney, Agent, or Firm*—Michael J. Urbano

[57] ABSTRACT

Described is a temperature compensation circuit comprising a transistor, a device (to which compensated voltage is to be applied) connected to the collector, and a plurality of resistors forming a voltage divider. A node separates the resistors into two branches and is connected to the base, and a temperature sensor having a negative temperature coefficient of resistance is located in one of the branches. The branches are mutually adapted so that the ratio of the resistance of the branch containing the sensor to the sum of the resistances of both branches is a linear function of temperature. An application of this circuit to the control of the bias voltage supplied to an avalanche photodiode is specifically described.

4 Claims, 7 Drawing Figures

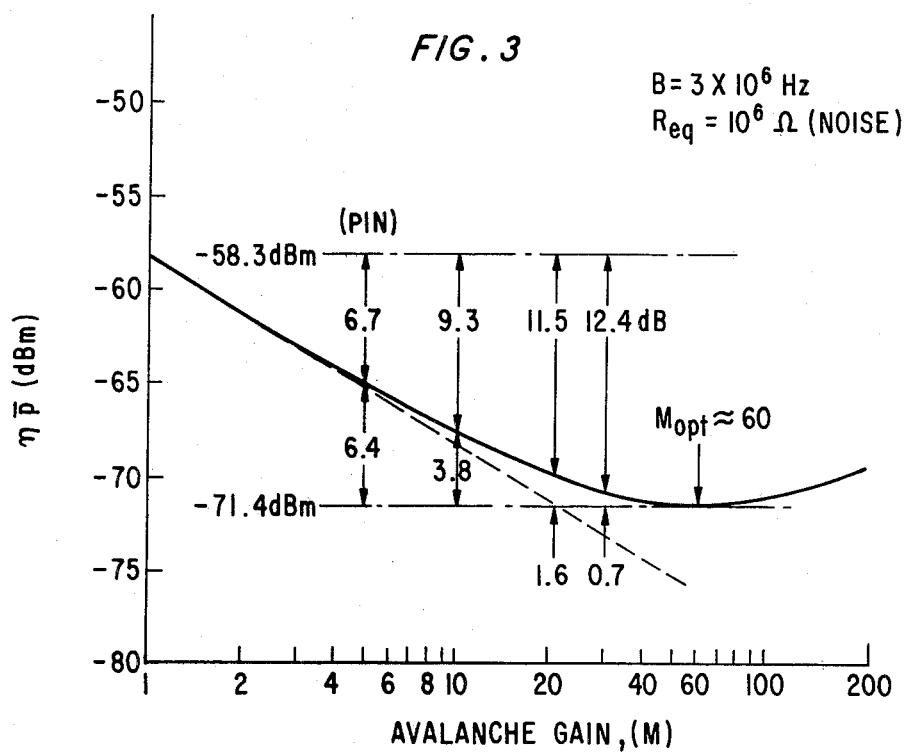

TEMPERATURE COMPENSATION CIRCUIT

BACKGROUND OF THE INVENTION

This invention relates to circuits which compensate for temperature sensitive variations in device parameters such as, for example, the gain of an avalanche photodiode.

Both PIN photodiodes and avalanche photodiodes (APDs) are being considered as detectors for fiber optic communication systems. The low noise carrier multiplication of an APD increases receiver sensitivity, compared to an identical receiver using a PIN diode, by amount ranging from 10 to 15 dB of optical power, depending on details of the amplifier design, bit rate, etc. This enhancement of sensitivity, however, is achieved at the expense of having to accurately control the bias voltage of the APD and is complicated by the fact that the APD gain versus voltage relationship is temperature dependent.

The dependence of the gain of a typical $n^+p\pi p^+$ APD on bias voltage for several different temperatures is shown in FIG. 1. The gain at a given temperature increases rapidly with increasing reverse bias at low voltages (in this case at approximately 50V) corresponding to sweepout of the device, and then increases more gradually until avalanche breakdown is approached where the gain also increases very rapidly. If the temperature of the device is increased, the gain for a given bias voltage decreases because of the negative temperature dependence of the ionization coefficients for holes and electrons. In order to maintain a constant gain as a function of temperature it is thus necessary to vary the bias voltage of the device in a controlled manner. Failure to do so can cause the APD to be driven into breakdown where it becomes exceedingly noisy, thereby drastically reducing the signal to noise ratio of the system.

In an effort to compensate for the temperature dependence of the APD gain versus voltage relationship, a number of techniques have been proposed in the prior art. One technique devised by L. E. Drew employs a second APD as a temperature dependent voltage regulator. In this technique the APD used to detect the light is operated at a voltage somewhat below the breakdown voltage of the reference APD. Provided the two APDs have similar temperature dependences, the detecting APD will operate at approximately constant gain. Possible difficulties with this technique are the need to use two APDs and to match the APD characteristics. Another technique, referred to as "full AGC" by P. K. Runge, employs feedback in which the electrical signal, proportional to the multiplied photocurrent, is detected and used to control the bias to the APD. In this method the output signal, and hence the APD gain, are held current — with constant light input — for aribitrary temperature changes. An added feature is that the output signal is held constant even if the intensity of the light is varied. A potential disadvantage of this type of control is the possibility of instabilities associated with the feedback system. Such instabilities in the form of low frequency motorboating have been observed when the input light signal is removed from the detector.

A variant of the above scheme employs a constant current power supply for the APD. Provided the APD current is proportional to the APD gain and to the input light signal, this scheme is essentially equivalent to that described above. However, if APD leakage currents are appreciable compared to the signal current, then their temperature dependence can result in nonideal operation.

A third method, more complicated than the above, detects the noise output of the device and uses this noise to control the bias and hence the gain of the APD. J. A. Raines et al., S.E.R.L. *Technical Journal*, Vol. 20, No. 1 (1970). The cost of implementing such a system, however, makes it unacceptable for presently contemplated fiber optic applications.

SUMMARY OF THE INVENTION

We have developed a simple, relatively inexpensive circuit which compensates for temperature dependent variations in device parameters. In a broad sense the circuit comprises a transistor with the device connected to the collector, a plurality of resistors forming a voltage divider and having a node separating the resistors into two branches and connected to the transistor base, and a temperature sensor located in one of the branches. An important feature of our invention is that the branches are mutually adapted so that the ratio of the resistance of the branch containing the sensor to the sum of resistances of both branches is a predetermined (e.g., linear) function of temperature over the desired operating range.

In another embodiment, which permits more accurate control of the collector voltage applied to the device (i.e., its bias), a variable resistor is connected across the collector and emitter of the transistor.

In a specific exemplary embodiment, our temperature compensation circuit comprises a single transistor, a thermistor having a negative tempeaure coefficient of resistance and three resistors in the form of a shunt regulator circuit which is designed to provide a linear temperature dependent bias voltage to an APD which in turn produces a constant APD gain as a function of temperature. An experimental realization of this circuit for use in a fiber optic communication receiver was found to give a temperature dependent bias voltage capable of maintaining the gain of a typical APD at a value of 20 to within 4 percent over the temperature range 0° to 50° C. and to within 15% between −20° C. and 70° C. Such a circuit used in conjunction with APDs designed specifically for low voltage operation would provide an improvement in receiver sensitivity of between 10 and 13 dB and could prove cost effective, even for inexpensive, low bit rate systems.

BRIEF DESCRIPTION OF THE DRAWING

These and other objects of our invention, together with its various features and advantages, can be more easily understood from the following more detailed description taken in conjunction with the accompanying drawing, in which:

FIG. 3 shows computed sensitivity for a receiver operating at 3Mb/s at an error rate of $10^{-9}$ as a function of avalanche gain M. Equivalent amplifier noise corresponds to a 1 MΩ resistor shunting the input of an ideal amplifier. The sensitivity of the receiver expressed in dBm is the product of the quantum efficiency of the detector, $\eta$, and the average optical power p. The dashed line is the extrapolated tangent to the sensitivity curve at unity APD gain;

FIG. 4 is a schematic diagram of one embodiment of our temperature compensation circuit for use with an APD;

DETAILED DESCRIPTION

In the following description our temperature compensation circuit will, for illustrative purposes only, be described with reference to compensating the temperature dependent gain of an APD of the type described by A. R. Hartman et al. in copending application Ser. No. 793,493, filed on May 4, 1977. It will be understood, of course, that our circuit is generally applicable to other devices having temperature dependent parameters. Before discussing the APD circuit in detail, however, it will be helpful to consider first the temperature dependence of avalanche gain and the dependence of receiver sensitivity on avalanche gain.

Figure 1:
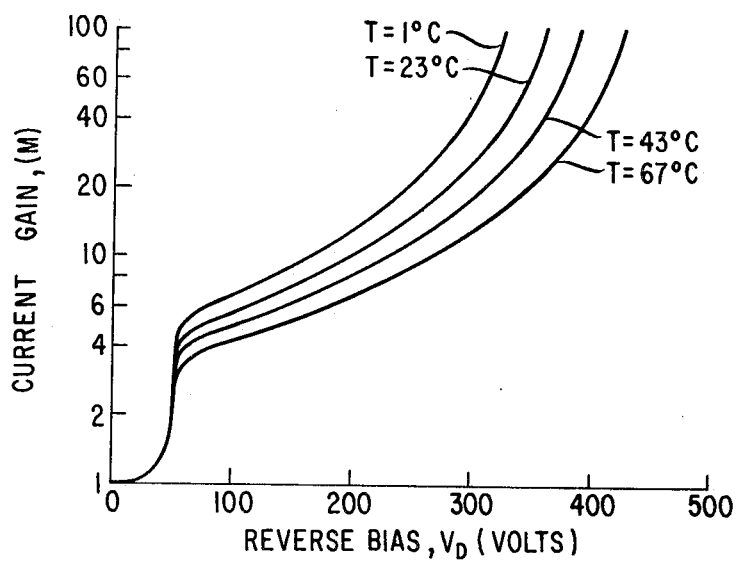
FIG. 1 shows avalanche gain versus reverse bias voltage at several temperatures for an $n^+p\pi p^+$ APD.
Figure 2:
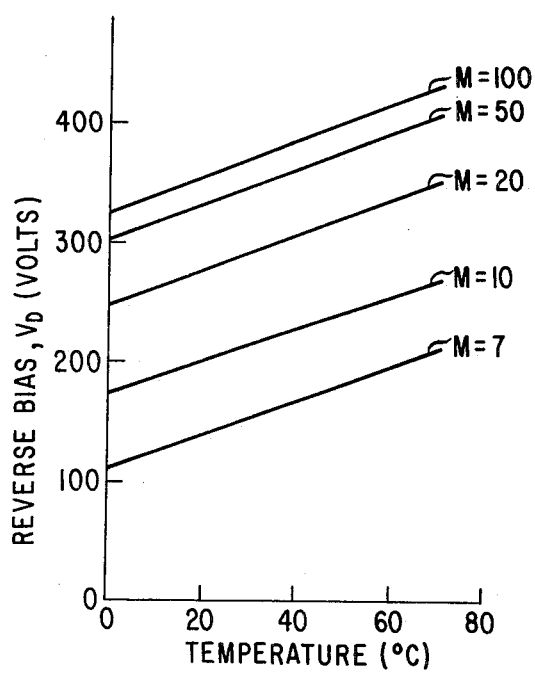
FIG. 2 shows voltage versus temperature curves for constant APD gain.

From a family of gain — voltage curves for various temperatures, the voltage versus temperature relationship required to obtain a constant APD gain can be derived. Such curves for the APD characterized in FIG. 1 are shown in FIG. 2. From these curves it is seen that the voltage required to obtain a constant gain is very nearly linearly dependent on the temperature change, with slightly different slopes for different gain values. Thus, to achieve a constant gain a temperature compensating circuit should produce a bias voltage versus temperature characteristic of the approximate form $$V_M(T) = V_M(T_o) + A_M(T-T_o) \quad (1)$$

where $T_o$ is some reference temperature, $V_M(T)$ and $V_M(T_o)$ are the voltages required to produce a gain M at temperature T and $T_o$, respectively, and $A_M$ is the slope of the curve shown in FIG. 2.

A second point concerns the dependence of the receiver sensitivity on the APD gain. An example of the calculated sensitivity of a receiver operating at 3 Mb/s is shown in FIG. 3. The curve is computed for a front end amplifier with an equivalent input noise resistance of 1MΩ, and the receiver sensitivity, expressed in dBm of optical power required to obtain an error rate of $10^{-9}$, is shown as a function of the gain of the APD. For an APD gain of unity (i.e., a PIN photodiode) the computed sensitivity, ηp, is −58.3 dBm (η is the quantum efficiency of the detector and p is the average optical power). Initially the sensitivity increases directly as the avalanche gain, M, ultimately reaching a maximum value of −71.4 dBm at an optimum gain of approximately 60. This ultimate sensitivity is limited by the excess noise of the APD which is assumed to have a k value of 0.035, where k is the ratio of hole and electron ionization coefficients. The overall improvement in sensitivity is thus 13.1 dB at optimum APD gain. On the other hand, using a gain of 10 results in an improvement of 9.3 dB in sensitivity and a gain of 20 produces an 11.5 dB improvement. Expressed another way, a conservative gain of 20 in the APD yields a receiver sensitivity within 1.6 dB of the optimum whereas a gain of 10 would be within 3.8 dB of the optimum.

Returning now to FIG. 1, it is clear that the degree of control of the bias voltage required to operate an APD at a gain of 10 or 20 is far less than that required if the device were to be operated near its optimum gain of 60. The analysis which follows assumes that the APD would be operated at a gain of 20 and describes a circuit designed to generate a temperature dependent bias voltage to achieve a nominal gain of 20 over an operating temperature range of 0° C. to 50° C. Such an APD would be suitable for a fiber optic receiver in a 3 Mb/s system, for example.

ANALYSIS AND DESIGN

The circuit shown in FIG. 4 is designed to produce a temperature dependent bias voltage which will hold the APD gain at a given value over as large a temperature range as possible. The circuit is a type of shunt regulator which comprises an NPN transistor $Q_1$ having its emitter connected through a resistor $R_4$ to a source of reference potential (i.e., ground) and its collector connected through a resistor $R_3$ to a first source of bias voltage $V_{b1}$. The base of $Q_1$ is connected to the node N of a resistive divider which includes a first resistor $R_1$ connected between N and ground and a second resistor $R_2$ connected between N and a second source of bias voltage $V_{b2}$.

The APD has its cathode connected through a resistor $R_5$ to the collector of $Q_1$ and through a capacitor $C_1$ to ground, whereas its anode is connected through a resistor $R_6$ to ground.

The APD bias voltage, $V_D$, is controlled by the collector current flowing in the transistor $Q_1$, which produces a voltage drop across resistor $R_3$. Temperature compensation is achieved by including a temperature sensitive element such as a thermistor in the base biasing network. Resistors $R_1$, $R_2$, $R_3$, and $R_4$ along with transistor $Q_1$ are used to provide the control. Resistor $R_5$ and capacitor $C_1$, are included for filtering purposes and $R_6$ is the load resistor for the APD. The latter three elements are not crucial to the operation of the circuit since the current through the APD is much smaller than the collector current and are included in this discussion only for completeness. The voltage $V_{b1}$ is a source of high voltage assumed to be supplied by some external power supply and $V_{b2}$ is the voltage used to bias the base network. In principle, $V_{b2}$ could be the same as $V_{b1}$, but for reasons described below separate power supplies were used.

The APD voltage, $V_D$, is given to a good approximation by $$V_D = V_{b1} - I_C R_3 - I_D(R_3+R_5+R_6) = V_{b1} - (R_3/R_4)(R_1/R_1+R_2)V_{b2} - V_{be}) - I_D(R_3+R_5+R_6) \quad (2)$$

where $I_D$ is the average APD current $I_C$ is the current flowing in the collector of $Q_1$ $V_{be}$ is the base - emitter voltage drop of $Q_1$ In deriving the above expression base current is assumed to be negligible. Assuming the APD current, $I_D$, to be independent of temperature, taking $dV_{be}/dT$ to be small, and choosing $R_3$ through $R_6$ to be fixed resistors, the APD bias will produce constant gain, Eq. 1, if $$\frac{d}{dT}\left[\frac{R_3}{R_4} \cdot \frac{R_1}{R_1 + R_2} V_{b2}\right] = -A_M \qquad (3)$$

Thus, the resistance ratio $R_1/(R_1+R_2)$ should ideally have a negative, linear temperature dependence.

Figure 5:
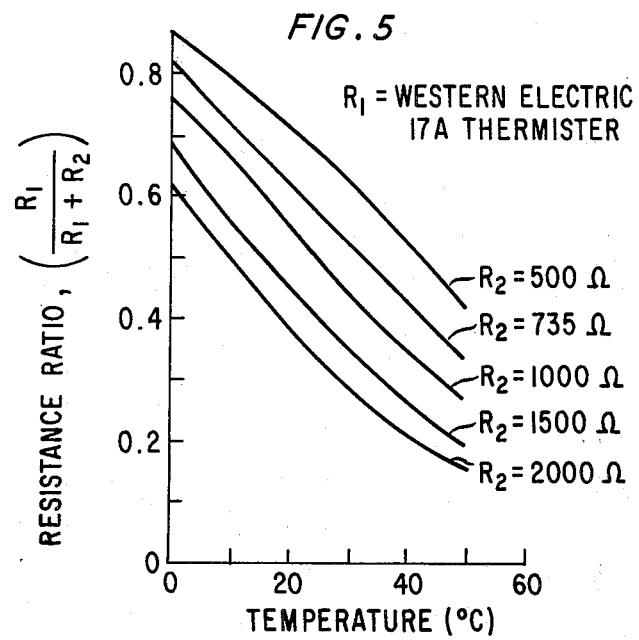
FIG. 5 shows the resistance ration R1/(R1+R2) of the circuit of FIG. 4 versus temperature for various values of the fixed resistor R2, where R1 is a WE 17A thermistor. An approximate linear dependence is obtained for R2 = 735Ω.

The simplest configuration which will give a negative temperature dependence uses a thermistor for $R_1$ and a fixed resistor for $R_2$. The temperature dependence of the resistance of a thermistor is given by S. M. Sze, *Physics of Semiconductor Devices*, John Wiley, 1969, p. 774 as $$R = R_o \exp\left[B(\frac{1}{T} - \frac{1}{T_o})\right] \qquad (4)$$

where $R_o$ and $B$ are parameters characteristic of the device and $T_o$ is some reference temperature. For example, a Western Electric 17A Thermistor has a nominal resistance of $1000\Omega$ at 24° C. and a highly nonlinear temperature dependence about that point. Although it is not at all clear that the resistance ratio $R_1/(R_1+R_2)$ can be made to have a linear range, FIG. 5 shows plots of the resistance ratio $R_1/(R_1+R_2)$ for various values of the fixed resistor when the WE 17A is used for $R_1$. From these curves we determined that there indeed exists an optimum value of $R_2 \approx 735\Omega$ which yields a nearly linear resistance ratio over the temperature range of 0°–50° C. From this value of $R_2$ the resistance ratio is found to be $$(R_1/R_1+R_2) = 0.817 - 0.0098T \qquad (5)$$

where T is expressed in degrees C. With these component values the APD bias, Eq. 2, is then given by $$V_D = \left[V_{b1} - I_D(R_3 + R_5 + R_6) + \frac{R_3}{R_4}(V_{be} - 0.817 V_{b2}) \right. \qquad (6)$$
$$\left. + \frac{R_3}{R_4} V_{b2}(0.0098T)\right]$$

The voltage-temperature relation for $M = 20$ taken from FIG. 2 is $$V_D(M=20) = 248 + 1.46T \qquad (7)$$

where T is also expressed in degrees C. Comparing Eqs. 6 and 7 it is seen that the proper $dV_D/dT$ is obtained if $$0.0098 \, V_{b2}(R_3/R_4) = 1.46$$

or $$V_{b2}(R_3/R_4) = 149, \qquad (8)$$

and the temperature independent term must satisfy the relation $$V_{b1} - I_D(R_3+R_5+R_6) + R_3/R_4(V_{be} - 0.817 V_{b2}) = 248 \qquad (9)$$

In satisfying the above equations the simplest approach would be to tie the base biasing circuit to the high voltage power supply. With properly designed, high resistance thermistors, this could be achieved. However since the WE 17A thermistor had a resistance value of nominally 1 kΩ, heating due to the high voltages applied would be excessive. Thus, we decided to separate the base biasing power supply from the high voltage source and a value of $V_{b2} = 5V$ was chosen. This then determined the resistance ratio to be $$R_3/R_4 = 29.8 \qquad (10)$$

Taking $V_{be} \approx 0.7V$, $$V_{b1} = 349 - I_D(R_3+R_5+R_6) \qquad (11)$$

For typical APD signal currents (e.g., $< 1 \mu A$) and reasonable resistance values (see the next section) the last term in Eq. 11 may be neglected and hence $V_{b1} \approx 349V$. The values of the resistors $R_3$ and $R_4$ are determined by the magnitude of the control current $I_c$ chosen. Picking $I_c = 1$ mA at T = 24° C. and noting that for $Q_1$ $V_{base} = 2.88V$ and hence $V_{emitter} \approx 2.18V$, also at T=24° C., then $R_4 \approx 2.2$ kΩ and $R_3 \approx 66$ kΩ. These circuit component values were chosen for the experimental purposes only. Considerable latitude is permissible in the choice of the values.

EXPERIMENTAL RESULTS

In the experiments we performed the output supply voltage of the circuit (i.e., the collector voltage of $Q_1$) was measured as the ambient temperature was varied. The performance of the circuit was then evaluated by comparing the supply-voltage versus temperature characteristics produced by the circuit with the desired bias voltage versus temperature characteristics for the APD at constant gain. The circuit element values were $R_2 = 735\Omega$, $R_3 = 65$ kΩ and $R_4 = 2.2$ kΩ. The circuit to the left hand side of the dotted line in FIG. 4 was omitted in these experiments since this circuit path draws very little current and its effect on the performance of $Q_1$ is negligible. $R_1$ was a Western Electric 17A thermistor, and $Q_1$ was a high voltage MPS -A-42 NPN transistor. For the temperature tests the circuit was kept in the chamber of a Thelco model 10 oven. To obtain temperatures above room temperature the oven was operated in the normal manner; to obtain temperatures below room temperature cold nitrogen vapor was driven into the chamber of the oven by means of a heater inserted into a liquid nitrogen Dewar. The temperature of the thermistor in the circuit was measured by using a thermistor thermometer (YSI Model 42SC) whose temperature sensor was attached directly to the 17A thermistor by silver paint. The thermistor thermometer was preferred to a mercury thermometer because the transient ambient temperature of the oven was often different from the thermistor temperature. The output supply voltage of the circuit was measured by using a Keithley 165 Autoranging Multimeter.

Figure 6:
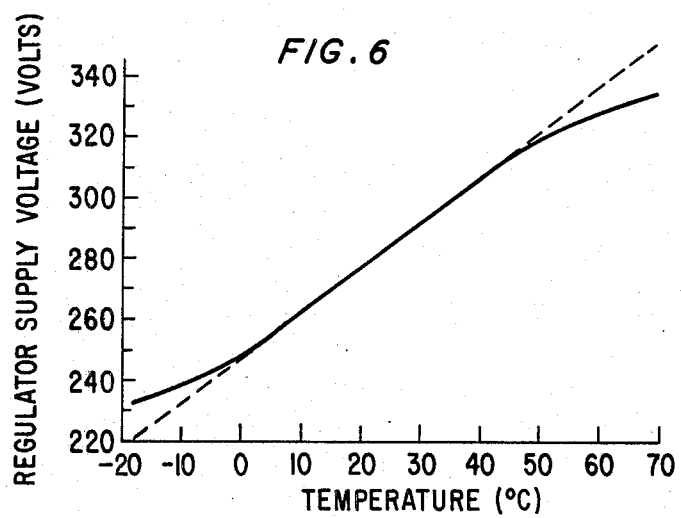
FIG. 6 shows the experimentally measured output voltage across Q1 of FIG. 4 versus temperature (solid curve) and idealized linear dependence (dotted line)

A plot of the output voltage of the regulator as a function of temperature is shown in FIG. 6. The experimentally determined voltage-temperature curve (solid line) is seen to be extremely linear over the temperature range from 0° C. to 50° C., falling below the desired linear dependence (dashed line) at temperatures above 50° C., and above the curve for temperatures below 0° C.

This circuit provided the desired temperature-voltage dependence required to stabilize the APD gain over the temperature range from 0° to 50° C. The voltage deviated from the desired linear dependence both at low and high temperatures. The effect of this deviation on the resulting APD gain was determined from the measured gain curves plotted in FIG. 1 and the extrapolations of their temperature dependence derived by curve fitting. The voltage provided by the circuit at −20° C. was 231V which gave an APD gain of 23 rather than the nominal 20. This deviation resulted in an increase in overall system gain of 1.2 dB; i.e., electrical power gain, not dB of optical power. At the high temperature limit of 70° C. the circuit produced a voltage of 335V giving an APD gain of 17 or a decrease in system gain of 1.4 dB. Both of these variations in gain can easily be compensated for by AGC circuits in post amplifiers of typical receivers. The effect on receiver sensitivity was an increase of 0.4 dB at −20° C. and a decrease of approximately 0.5 dB at 70° C. It is clear, therefore, that this circuit performed within reasonable limits over a 90° temperature swing from −20° C. to +70° C.

From a systems engineering point of view one would, of course, take into account the dependence of the circuit on variations in component parameters, power supply voltages and APD parameters; e.g., the dependence of APD gain on applied bias.

Figure 7:
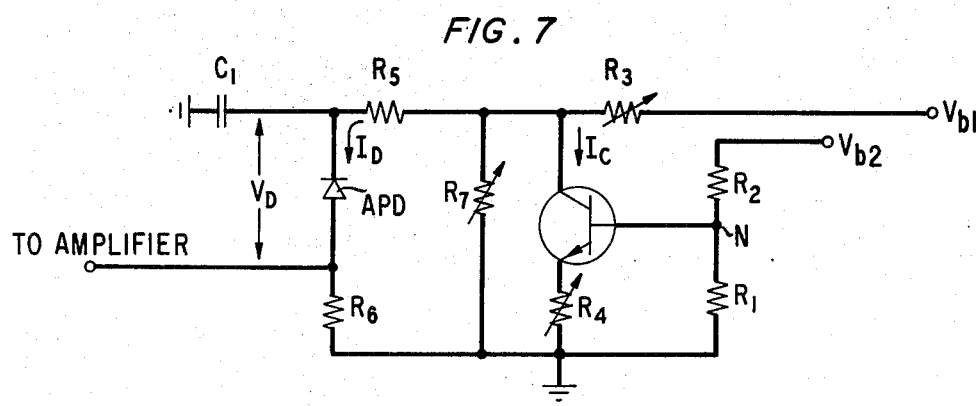
FIG. 7 is a schematic diagram of another embodiment of our circuit using variable resistors which can be functionally trimmed to more exactly match circuit voltages to those of a particular APD.

Although the compensation circuit of FIG. 4 provides adequate control of the bias voltage for most fiber optic receiver applications, if more accurate control is required, the circuit shown in FIG. 7 can be employed. This circuit is essentially the same as that shown in FIG. 4 but has an additional shunting resistor $R_7$ connected between the collector of $Q_1$ and ground. For this circuit the APD voltage is given by $$V_D = \frac{R_7}{R_3 + R_7} \left[ V_{b1} - \frac{R_3}{R_4} \left( \frac{R_1}{R_1 + R_2} V_{b2} - V_{be} \right) \right] - \left( \frac{R_3 R_7}{R_3 + R_7} + R_5 + R_6 \right) I_D \quad (12)$$

Neglecting the term proportional to the APD current, $I_D$, the APD voltage is just $R_7/(R_3+R_7)$ times the voltage delivered by the previous circuit. By varying $R_3$, $R_4$ and $R_7$ it is possible to achieve the proper slope and intercept voltage of the APD voltage - temperature characteristic in the following manner: From a given lot of APDs $dV/dT$ could be determined, or if sufficient tolerance existed, an average of many lots could be used. The room temperature operating voltage, $V(T_o)$, for a given APD could be rapidly determined by biasing the APD from a low impedance power supply to produce the desired gain. The proper values of the fixed resistors $R_3$, $R_4$ and $R_7$ could then be determined to give the proper room temperature voltage and the desired slope. The APD test can be easily automated and the computation and trimming resistor values could be done on a functional trim station.

Although our APD was supplied with a bias voltage of approximately 400V, it is not necessary to operate APDs at such a high voltage level, especially if the ultimate in sensitivity is not required. In fact, APDs which will operate below 200V have been fabricated and it seems possible to reduce this value further.

It is to be understood that the above-described arrangements are merely illustrative of the many possible specific embodiments which can be devised to represent application of the principles of our invention. Numerous and varied other arrangements can be devised in accordance with these principles by those skilled in the art without departing from the spirit and scope of the invention. In particular, while our invention was described in terms of providing linear temperature compensation for a device such as an APD having a negative temperature coefficient of resistance, it will be apparent to those skilled in the art that (1) the circuit can be used to supply voltage to devices having a positive temperature coefficient of resistance, in which case the sensor would also have a positive coefficient, and (2) the circuit can be used to supply voltage which varies with temperature nonlinearly (e.g., the bottom curve of FIG. 5). Other nonlinear functions could be realized by suitable modifications of the base bias network (e.g., making $R_2$ instead of $R_1$ a thermistor or including a second thermistor in parallel with $R_1$ and $R_2$).

What is claimed is:
1. A temperature compensation circuit comprising
   a transistor having emitter, base and collector electrodes,
   an avalanche photodiode connected between said collector electrode and a source of reference potential so as to reverse bias said photodiode, said photodiode having the characteristic that to maintain its gain fixed at a predetermined level with increasing temperature, the reverse bias voltage applied thereto must increase essentially linearly with increasing temperature,
   a plurality of resistors forming a voltage divider and having a node separating said plurality into two branches, said node being connected to said base electrode,
   one of said branches including a thermistor and being connected between said node and said source of reference potential, and the other of said branches being connected between said node and a source of bias voltage,
   said branches being mutually adapted so that the ratio of the resistance of said one branch to the sum of the resistances of said two branches decreases essentially linearly with temperature over the operating range of said circuit so that the gain of said photodiode remains essentially constant at said predetermined level with changes in temperature.
2. The circuit of claim 1 further including a shunting resistor connected between said collector electrode and said source of reference potential.
3. A temperature compensation circuit comprising
   a transistor having emitter, base and collector electrodes, said emitter electrode being resistively coupled to a source of reference potential and said collector electrode being resistively coupled to a first source of bias voltage,
   an avalanche photodiode having one terminal resistively coupled to said collector electrode and its other terminal resistively coupled to said source of reference potential so as to reverse bias said photodiode, said photodiode having the characteristic that to maintain its gain fixed at a predetermined level with increasing temperature, the reverse bias voltage applied thereto must increase essentially linearly with increasing temperature,
   a plurality of resistors forming a voltage divider and having a node separating said plurality into two branches, said node being connected to said base electrode,
   one of said branches including a thermistor having a negative temperature coefficient of resistance and being connected between said node and said source of reference potential, and the other of said branches being connected between said node and a second source of bias voltage, said branches being mutually adapted so that the ratio of the resistance of said one branch to the sum of the resistances of said two branches decreases essentially linearly with temperature over the operating range of said circuit so that the gain of said photodiode remains essentially constant at said predetermined level with changes in temperature.

4. The circuit of claim 3 further including a capacitor connected between said one terminal of said photodiode and said source of reference potential.

* * * * *